United States Patent [19]

Satriano et al.

[11] Patent Number: 5,049,973
[45] Date of Patent: Sep. 17, 1991

[54] HEAT SINK AND MULTI MOUNT PAD LEAD FRAME PACKAGE AND METHOD FOR ELECTRICALLY ISOLATING SEMICONDUCTOR DIE(S)

[75] Inventors: Robert J. Satriano, Hackettstown, N.J.; Thomas R. McLean, Mountaintop, Pa.

[73] Assignee: Harris Semiconductor Patents, Inc., Melbourne, Fla.

[21] Appl. No.: 543,307

[22] Filed: Jun. 26, 1990

[51] Int. Cl.[5] .............................................. H01L 23/48
[52] U.S. Cl. ........................................ 357/70; 357/69; 357/81
[58] Field of Search ............................. 357/81, 70, 69

[56] References Cited

U.S. PATENT DOCUMENTS

| | | | |
|---|---|---|---|
| 3,569,797 | 3/1971 | Simmons | 317/234 |
| 3,893,158 | 7/1975 | Lincoln | 357/70 |
| 4,003,544 | 1/1977 | Bliven et al. | 249/95 |
| 4,114,177 | 12/1978 | King | 357/19 |
| 4,446,375 | 5/1984 | Aird | 250/551 |
| 4,556,896 | 12/1985 | Meddles | 357/70 |
| 4,633,582 | 1/1987 | Ching et al. | 29/827 |
| 4,740,868 | 4/1988 | Hawkins | 361/421 |
| 4,783,428 | 11/1988 | Kalfus | 357/81 |
| 4,807,018 | 2/1989 | Cellai | 357/70 |
| 4,984,065 | 1/1991 | Sako | 357/70 |

*Primary Examiner*—Edward J. Wojciechowicz
*Attorney, Agent, or Firm*—K. R. Glick

[57] ABSTRACT

A packaging assembly for electrical components includes a heat sink having a mounting surface upon which certain ones of the electrical components are mounted. An associated lead frame is rigidly secured to an edge of the heat sink, and one or more extended ends of selected leads thereof are formed into mounting pads positioned over the mounting surface of the heat sink for receiving other ones of the electrical components. Dielectric material is positioned between the mounting pads and the heat sink, for electrically isolating the electrical components mounted upon the mounting pads from one another and from electrical components mounted directly on the heat sink. The electrical components and proximate ends of the leads of the lead frame are electrically interconnected via electrical conductors, and the assembly is encapsulated with a plastic material about the heat sink and proximate ends of the lead frame, whereafter bridge elements between the leads of the lead frame are severed.

14 Claims, 5 Drawing Sheets

HEAT SINK AND MULTI MOUNT PAD LEAD FRAME PACKAGE AND METHOD FOR ELECTRICALLY ISOLATING SEMICONDUCTOR DIE(S)

FIELD OF THE INVENTION

The field of the present invention relates generally to packages and methods for mounting semiconductor dies and more specifically to such packages including heat sinks and lead frames with one or more electrically isolated semiconductor dies.

BACKGROUND OF THE INVENTION

Present packaging techniques for electrically isolating semiconductor dies from the package itself or other semiconductor dies included in the package is typically obtained via brazing or soldering ceramics, such as beryllium oxide, aluminum oxide, and so forth, first to predetermined locations on the surface of the main mounting pad of the associated package, and thereafter brazing or soldering the appropriate semiconductor dies to the soldering ceramics so deposited on the main mounting pad. Such an isolation method is expensive, due to the relatively high cost of ceramics, and the additional labor cost in first attaching the ceramics to the mounting pad, and thereafter the semiconductor dies to the ceramic so deposited.

There are many different packaging configurations and methods for mounting semiconductor devices, such as integrated circuits and/or semiconductor dies. Eight of these prior methods and mounting assemblies for packaging semiconductor dies are discussed in the following paragraphs.

Simmons U.S. Pat. No. 3,569,797 teaches a mounting assembly for a semiconductor device for electrically isolating the die from the housing, which housing is filled with a thermal conducting filler to provide for a good thermal conductivity between the electrically isolated die and the housing. The encapsulated lead frame 17 includes leads 19, 20, and 21. These leads each are rigidly connected at one end to a mounting tab 18. The other end of one of the leads, namely lead 20 terminates in a rectangular-like mounting platform 25 at its other end for receiving a semiconductor die. The other ends of leads 19 and 21 have lateral extending portions 26 and 27, respectively, terminating at riser sections 28 and 29, the other ends of the latter terminating to sections 30 and 31, respectively having inwardly extending arms 32 and 33, respectively, which are formed to provide spring pressure on the top of a die for forcing the same against the platform 25.

Lincoln, U.S. Pat. No. 3,893,158 discloses in FIG. 10 a lead frame 130 including centrally located extensions of the leads for providing mounting surfaces for dies 132, 134 and 136. Similar lead extensions terminating in mounting pads for dies are shown in other of the figures of this patent. Wire bonding is used to connect wires between the dies and various ones of the contact fingers. The lead frame assembly is epoxy encapsulated within the housing. Note that the dies are electrically isolated from one another relative to their mounting, but are oriented for permitting a light emitting die to transmit light to a light detecting die.

Bliven et al U.S. Pat. No. 4,003,544 shows in FIG. 1 a lead frame including extensions of contact fingers for providing centrally located mounting pads for integrated circuit chips or dies. The particular configuration is designed to facilitate the plastic encapsulation of the lead frame and die assembly.

King U.S. Pat. No. 4,114,177 teaches an optically coupled device including a lead frame having leads with extensions into the central portion of the frame, with landing pads or mounting pads at the ends of the lead extensions for receiving a photo detector integrated circuit die on one pad, and a light emitting integrated circuit on an opposing pad from a lead on the opposite side of the lead frame.

Aird U.S. Pat. No. 4,446,375 discloses a lead frame for receiving the integrated circuit dies associated with an optical coupler. The dies are mounted on pads that are centrally located, with each pad being provided via extensions of leads of the lead frame. Other than centrally located lead extensions serving as mounting pads for integrated circuit dies.

Meddles U.S. Pat. No. 4,556,896 teaches a lead frame structure for a semiconductor device. The structure includes centrally located mounting pads as extensions of leads for mounting integrated circuit dies. The lead elements are arranged to facilitate the molding of a housing about the lead frame assembly.

Ching et al U.S. Pat. No. 4,633,582 discloses a lead frame assembly that includes centrally located mounting tabs as extensions of lead fingers of the lead frame, upon which integrated circuit dies are mounted. The lead frame design is intended to insure a coplanar relationship between first and second lead assemblies of the overall lead frame, as the same as rotated from one position to another during manufacturing of the optoisolator device associated with the lead frame.

Hawkins U.S. Pat. No. 4,740,868 discloses a lead frame that includes a plurality of rails upon which a plurality of integrated circuit dies can be mounted. In addition to providing mounting surfaces, the rails also function as heat sinks. The rails are laid out in a manner for providing electrical isolation between rails.

SUMMARY OF THE INVENTION

An object of the invention is to mount a plurality of semiconductor dies in a common package, with one or more of the semiconductor dies being electrically isolated from one another.

Another object of the invention is to provide an improved package for mounting a plurality of semiconductor dies.

With the problems of the prior art in mind, the above objects and other objects are provided by the present invention including a lead frame having one or more leads of a lead frame extending into and located above a mounting area for semiconductor dies of the associated package. The lead extensions or fingers are formed at their respective ends for providing a mounting area of sufficient size to receive a given semiconductor die. The semiconductor die mounting surfaces of the extended leads or fingers of the lead frame are secured to an underlying mounting surface of the package via a dielectric adhesive in one embodiment, and in another embodiment via mechanical supports located between the underside of the lead frame extensions and the underlying mounting surface, for example. Also, in one embodiment of the invention the underlying mounting surface is a heat sink.

BRIEF DESCRIPTION OF THE DRAWING

The present invention will be described in detail below relative to the associated drawings, in which like items are identified by the same reference designation, wherein.

DETAILED DESCRIPTION OF THE INVENTION

As shown in FIGS. 1 through 5, various embodiments of the invention are illustrated in association with a TO-218 JEDEC Outline Package, but this is for purposes of illustration only. The invention in its various embodiments is not limited to such a package outline, and may be applied as described below, to any package outline in which isolation of the semiconductor dies or other components is required.

Figure 1:
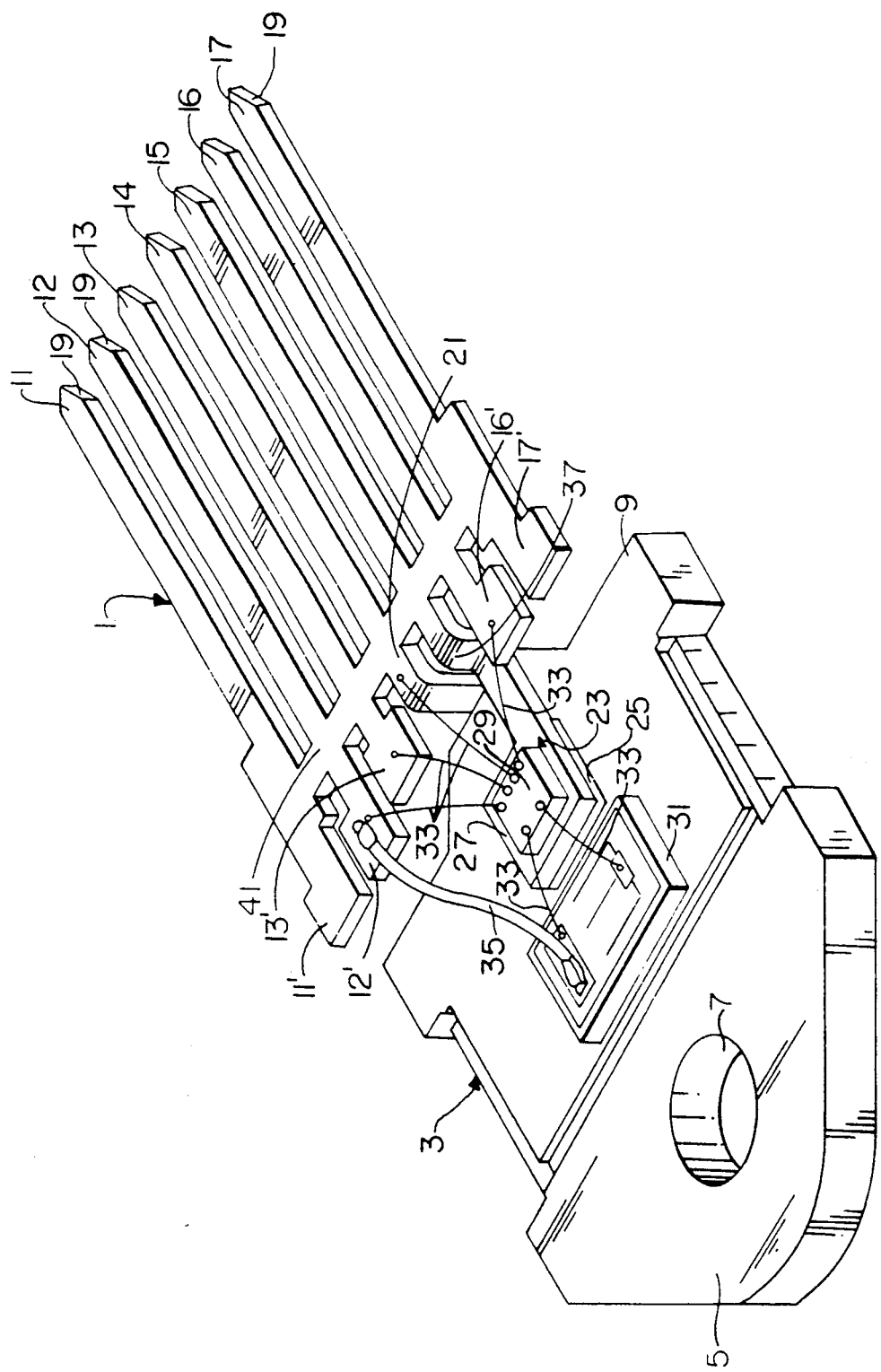
FIG. 1 is a pictorial view of one embodiment of the invention prior to encapsulation thereof, and severance of the bridges between individual leads of an associated lead frame.

In one embodiment of the invention as shown in FIG. 1, a lead frame 1 is attached to a heat sink 3, as will be described in detail. The end of the heat sink 3 farthest from the lead frame 1 consists of a mounting boss 5 having a centrally located through hole or mounting hole 7. In this example, the portion of the heat sink 3 below the mounting boss 5 provides a mounting surface 9 for receiving semiconductor dies or other components, for example. The lead frame 1 and heat sink 3 are typically fabricated from a copper alloy, and are nickel plated, in this example.

The lead frame 1 is shown in this example to include seven leads or contact fingers 11 through 17, respectively. However, the number of such leads or contact fingers 11-17 is not meant to be limiting, and lead frames having less than 7, or greater than 7 such leads up to a practical limit can be utilized. The ends 19 of contact fingers 11 through 17 may be configured for plugging into a socket (not shown), or for being soldered in place on a printed circuit board, for example. Note also in this example that the end 21 of lead 14 is bent at a right angle and secured to the end of the heat sink 3 via either brazing, or welding, for example, to insure both rigid bonding and electrical contact with heat sink 3.

In this one embodiment of the invention, the opposite end of contact finger or lead 15 has a downwardly offset paddle-like portion 23 located over and spaced slightly away from the mounting surface 9 of heat sink 3. A dielectric material 25 is placed between the mounting surface 9 and the underside of the paddle 23 of lead or contact finger 15. In this manner, a component mounted on top of the paddle or mounting pad 23 is electrically isolated from all but contact finger or lead 15.

In the preferred embodiment of the invention, a plastic encapsulant, such as Plaskon ™ 3100LSLF, a low stress-long flow encapsulant manufactured under the Plaskon trademark by Rohm and Haas, Bristol, Pa., is allowed to flow between the mounting surface and underside of paddle 23, thereby electrically isolating mount surface 27 from the heat sink 3, and other portions of the lead frame 1. Alternatively, the dielectric material 25 can be a dielectric adhesive, such as Polyimidet ™. In yet another alternative embodiment, the dielectric material 25 can be provided under the paddle or mount pad 23 via a mechanical support such as a dielectric shim of appropriate material.

In this example, a semiconductor die 29 is secured to the top surface 27 of the mounting pad or paddle 23. The substrate of the semiconductor die 29 is typically electrically connected to lead 15 via an appropriate conductive adhesive, for example. Another semiconductor die 31 is secured via an electrically conductive adhesive, in this example, to the mounting surface 9 of heat sink 3, as shown. Ultrasonic bonding is used, in this example, to attach wires 33 between the semiconductor dies 29 and 31, and between semiconductor die 29 and contact fingers 12, 13, 14, and 16. Wires can be as small as 0.0015 inch diameter, in typical applications. Also, a heavier wire, typically aluminum and 0.010 inch diameter, in this example, serving as an output connection is ultrasonically bonded between a terminal pad 12' of contact finger 12 and semiconductor die 31. Note also that the paddle or mounting pad 23 at the extended end of lead or contact finger 15 is offset via a shallow downward extending L-shaped bend 37. Also, in the preferred embodiment of the invention the semiconductor die 31 is soldered to the mounting surface 9 of heat sink 3. Note also that the non-extended ends of contact fingers or leads 11, 12, 13, 16, and 17 closest to heat sink 3 are formed into rectangular-like connection pads 11', 12', 13', 16', and 17', respectively, that are substantially wider than their associated leads, for facilitating the electrical interconnection and attachment of wires 33 or conductors 35, as shown.

Figure 2:
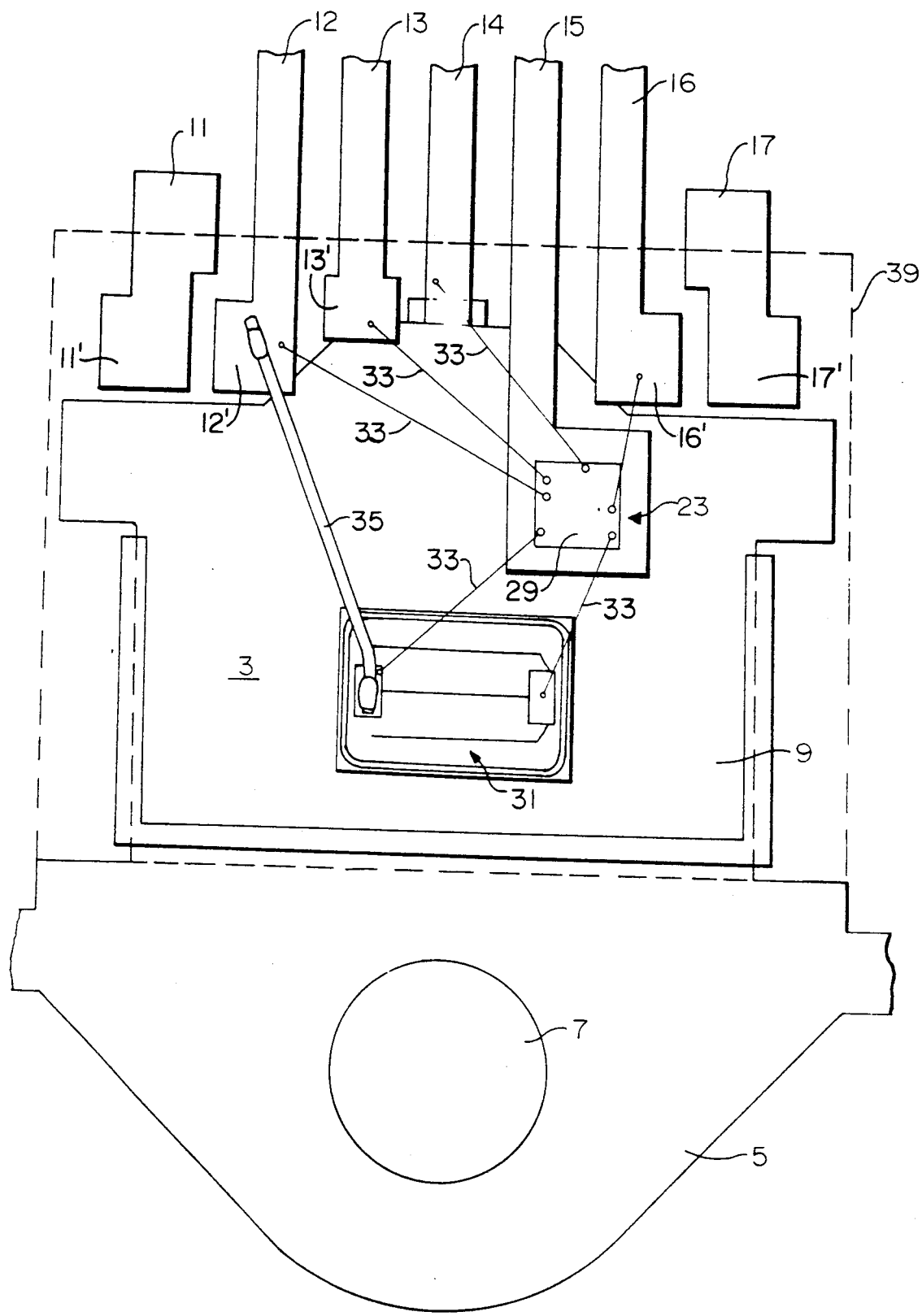
FIG. 2 is a partial plane top view showing enlarged details of the embodiment of FIG. 1.

An enlarged view of the main portions of the embodiment of the invention of FIG. 1 are shown in FIG. 2. The completed package is shown with the assembly being encapsulated with Plaskon ™ 3100 (manufactured by Rohm and Haas, Bristol, Pa.), forming the packaging silhouette shown by the phantom lines 39. Looking through the encapsulant material 39, note that the bridges 41 of lead frame 1, originally interconnecting leads or contact fingers 11 through 17, respectively, have been cut away or severed, breaking that electrical and mechanical connection between the leads 11 through 17, respectively. In the illustration shown, leads 11 and 17 are truncated proximate the end of the encapsulant material 39, in this example, in that these leads are unused. In other applications, these leads 11 and 17 may of course be utilized, and therefore not cut off.

In another embodiment of the invention (see FIG. 3), lead frame 1 is shown in a modified form for providing a paddle or mounting pad 23 by extending and offsetting the end of lead or contact finger 15, as in the first embodiment of the invention, but further includes an extension of the end of lead or contact finger 11 for providing an offset paddle or mounting pad 43, as shown. As previously described, a dielectric material 25, such as a dielectric adhesive or encapsulant, is located between the bottom surfaces of the mounting pads 23 and 43, and the mounting surface 9 of heat sink 3. Also, in this example, semiconductor dies 45 and 47 are secured to the mounting pads 43 and 23, as shown via soldering or an electrically conductive adhesive. Also, another semiconductor die 49, is in this example soldered to the mounting surface 9 of heat sink 3. Wires 33 are ultrasonically bonded between the semiconductor dies 45, 47, and 49, and terminal pads 13', 14', 16', and 17', as shown in this example. Electrical conductor 51, typically aluminum, is ultrasonically bonded between a semiconductor die 49 and paddle 43, as shown, for providing electrical interconnection therebetween. Similarly, electrical conductor 53 is typically aluminum, and is ultrasonically bonded between a terminal pad 12' at the end of lead 12, and semiconductor die 45, in this example.

Figure 3:
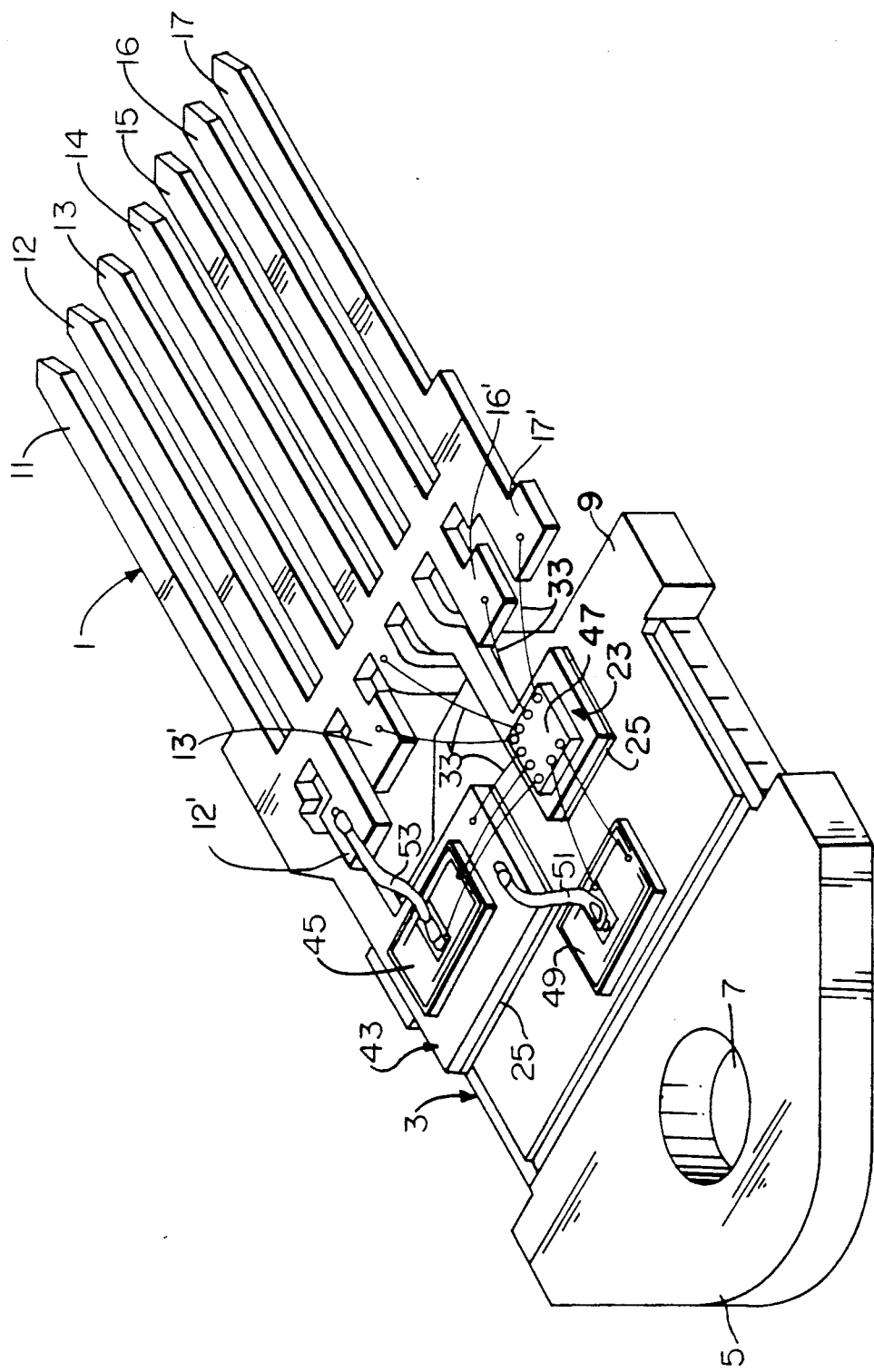
FIG. 3 is a pictorial view of another embodiment of the invention prior to an encapsulation step, and severance of the bridges between the leads of an associated lead frame.
Figure 4:
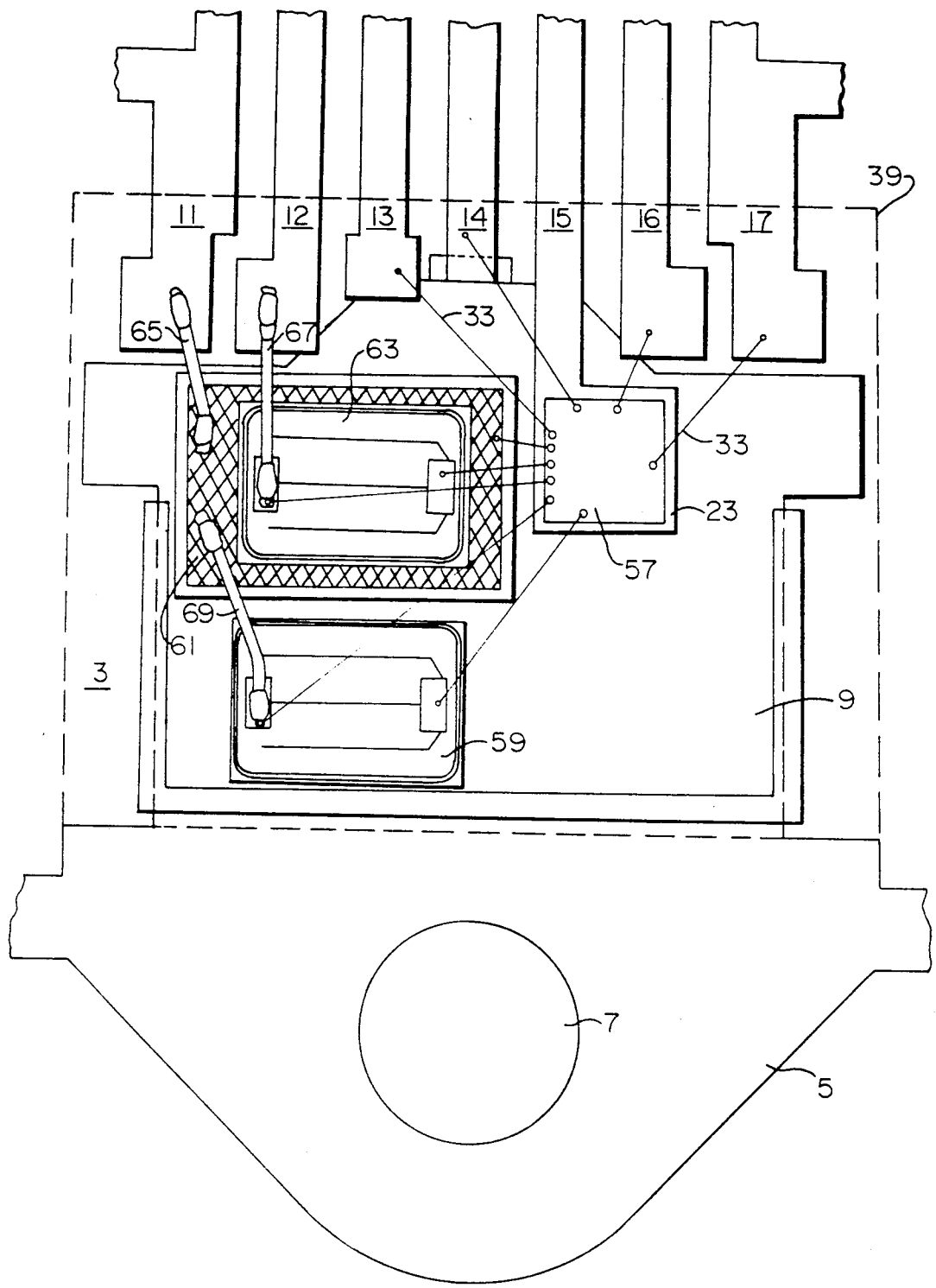
FIG. 4 is a partial top plane view of an alternative embodiment of the invention.

In FIG. 4, a third embodiment of the invention, shown in this illustration as an enlarged plane view of the top of heat sink 3, and looking through an encapsulant material 39 shown by the broken lines. In this embodiment, the end of lead or contact finger 15 is extended as in the previous embodiments for providing a paddle or mounting pad 23 that is electrically isolated from the heat sink 3 via dielectric material 25 (not shown) placed therebetween (see FIGS. 1 and 3). A semiconductor die 57 is mounted on the mounting pad 23. Another semiconductor die 59 is soldered to the mounting surface 9 of heat sink 3. In this embodiment, instead of extending the end of lead of contact finger 11 as in FIG. 3 for providing a paddle or mounting pad 43, a conventional ceramic dielectric pad 61 is soldered on its under-surface to the mounting surface 9 of heat sink 3. A semiconductor die 63 is secured to the top of the ceramic dielectric pad 61 through use of an appropriate adhesive, for example. Also, ultrasonic bonding is used as illustrated in other embodiments of the invention, for electrically connecting small wires 33 between the semiconductor die 57, 59, and 63, respectively, and between these die and terminal pads 13', 14', 16', and 17', in this example. Heavier conductors 65, 67, and 69, are typically aluminum, are ultrasonically bonded between ceramic pad 61 and pad 11', semiconductor die 63 and pad 12', and between semiconductor die 59 and ceramic pad 61, respectively, as shown. In this manner, the semiconductor dies 57 and 63 are electrically isolated from heat sink 3, from one another, and from various ones of the leads or contact fingers 11 through 17.

Figure 5:
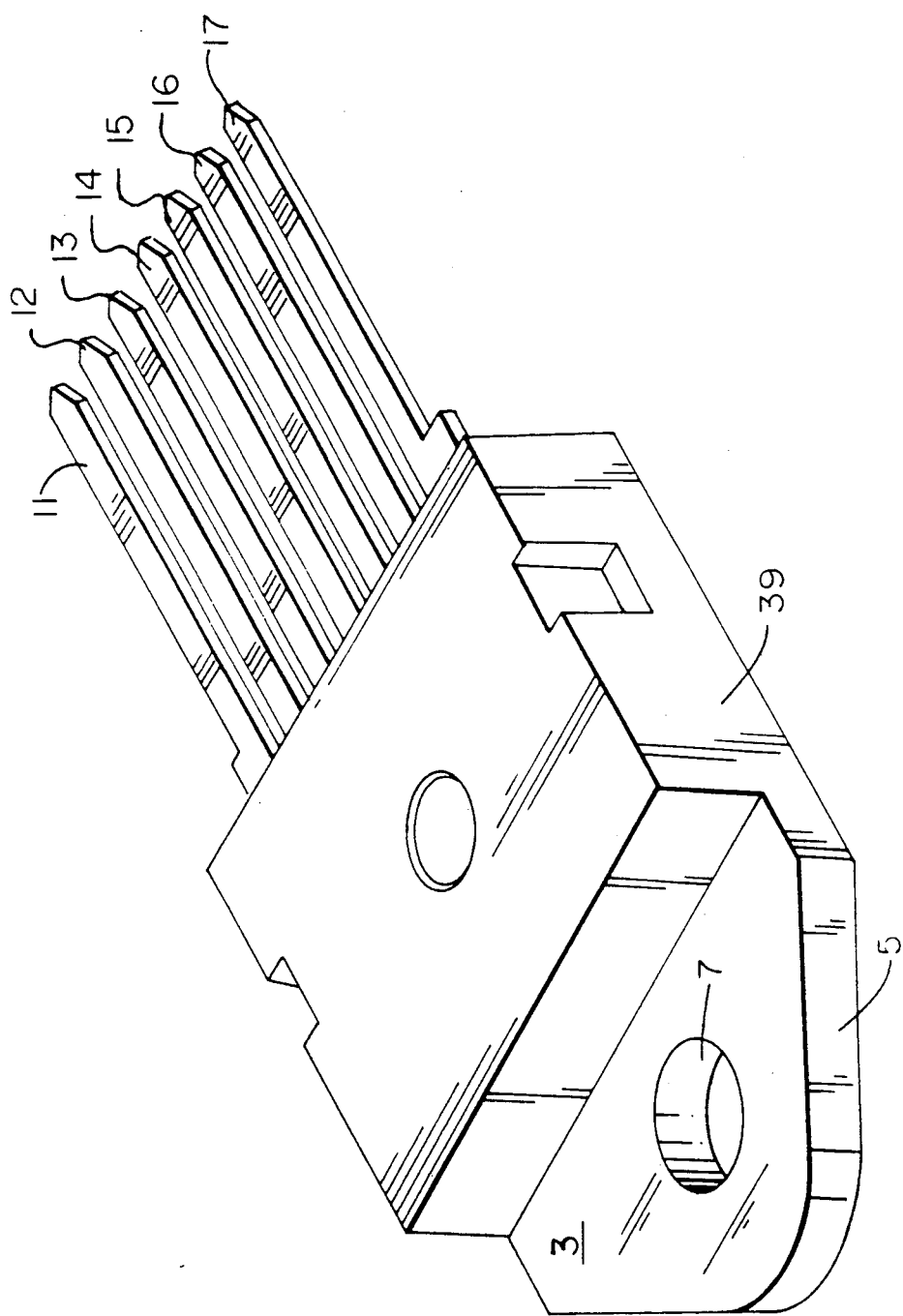
FIG. 5 is a pictorial view of a typically plastic encapsulated completed package as it would appear for the embodiments of the invention of FIGS. 1 through 4, for example.

In FIG. 5, a typical exterior view of the illustrated TO-218 Jedec package is shown including a plastic encapsulant 39, as previously described, and leads or contact fingers 11 through 17, for completing the package for either the embodiments of FIGS. 3 or 4, for example. As previously indicated, the various embodiments of the invention are not limited to the package outline illustrated herein. Note that the plastic encapsulating material 39 used to encapsulate the mounting surface 9 and its associated components, and a portions of the ends of lead frame 1, can be used to provide the dielectric material 25 for insuring electrical isolation of the mounting pads provided by extending one or more of the leads 11 through 17, in the illustrations given. The number of mounting pads provided by extending the ends of the contact fingers or leads of the package, as illustrated, is limited only by the space allowed by the specific package design. As previously mentioned, this concept can be applied to any package outline where electrical isolation of semiconductor dies or other components is required. Also note that the dielectric material 25 provides, in addition to electrical isolation between an associated mounting pad and the surface of a heat sink 3, a foundation for facilitating the ultrasonic bonding operation of the wires 33, in this example.

Although various embodiments of the invention have been illustrated herein, many other advantages and variations of the embodiments shown may be apparent to those of skill in the art. Such variations or alternative embodiments are meant to be covered by the spirit and scope of the appended claims, and the illustrated embodiments herein are not meant to be limiting.

What is claimed is:

1. An assembly for packaging electrical components, comprising:

a heat sink including a portion thereof providing a substantially flat mounting surface for receiving electrical components;

a lead frame including a plurality of juxtaposed leads, each being formed to provide contact fingers at outer ends, respectively, the inner portions of said leads being initially connected together via bridging elements formed therebetween, selected ones of inner ends of said leads being formed to provide terminal pads for receiving electrical conductors, at least one of said inner ends of said leads being rigidly attached to said heat sink for retaining said leads in a first plane substantially spaced above and parallel with the primary plane of the mounting surface of said heat sink, with the inner ends of a majority of said leads being substantially above a lower edge of the mounting surface of said heat sink, at least one of said inner ends being both extended and formed into a paddle-like mounting pad positioned over and spaced away from a preselected area of the mounting surface of said heat sink, said mounting pad having a top surface for receiving an electrical component;

a first dielectric material being inserted between a bottom surface of said mounting pad and the underlying mounting surface of said heat sink, for electrically isolating said mounting pad and its associated lead from said heat sink, and thereby so electrically isolating any electrical component mounted upon said mounting pad;

the one of said inner ends rigidly attached to said heat sink, being bent substantially at a right angle from the plane of said lead frame toward the plane of said heat sink, and rigidly attached to the face of an edge of said heat sink underlying said lead frame; and a second dielectric material being molded over and enclosing in an encapsulated manner, the mounting surface of said heat sink and associated electrical components, said mounting pad and its associated electrical component, and said terminal pads, whereby after said second dielectric material is formed about said assembly, said bridging elements between said leads are severed, leaving the inner ends of said leads bonded to and separated from said heat sink by said second dielectric material.

2. The assembly of claim 1, further including said at least one extended inner end being offset to position its associated mounting pad in a second plane lying between and parallel with said first plane and the primary plane of the mounting surface of said heat sink.

3. The assembly of claim 1, further including:

an electrical component rigidly mounted upon a top surface of said mounting pad of said extended inner end of an associated lead;

at least one other electrical component mounted upon said heat sink; and means for selectively electrically connecting various ones of said electrical components to one another, and to selected terminal pads of inner ends of associated leads.

4. The assembly of claim 1, wherein said first electric material consists of a solid polyamide pad.

5. The assembly of claim 1, wherein said second dielectric material consists of a plastic compound.

6. The assembly of claim 1, wherein said first and second dielectric material each consist of an epoxy.

7. The assembly of claim 3, wherein said second dielectric material is provided by said plastic compound flowing into and filling the space between said heat sink and said mounting pad of said extended inner end of at least one of said leads.

8. The assembly of claim 1, wherein said lead frame is formed in a single piece from a nickel plated copper alloy material.

9. A package assembly for packaging selected ones of a plurality of semiconductor die in electrical isolation to one another, comprising:

a heat sink with a mounting surface for receiving electrical components;

a lead frame formed in one piece with bridging elements between a plurality of juxtaposed leads in a common plane, an end of a first one of said leads being bent and secured to a side edge of said heat sink, for retaining said lead frame in a plane elevated substantially away from and parallel to the plane of said mounting surface of said heat sink;

selective second one(s) of said leads each having an extended end terminating in the form of a mounting pad for receiving a semiconductor die spaced away from and over said mounting surface of said heat sink; and a dielectric material located between said mounting pad(s) and the mounting surface of said heat sink, thereby both electrically isolating semiconductor die(s) mounted on said mounting pad(s), from one another and from electrical components mounted upon the mounting surface of said heat sink, and bonding said mounting pad(s) to said heat sink, said dielectric material also being located between the other portions of said leads overlying said heat sink for bonding the same to and electrically insulating said leads from said heat sink, whereupon completion of assembling and encapsulating said package, said bridging elements are severed.

10. The assembly of claim 9, further including:

a plurality of semiconductor die individually rigidly mounted upon the mounting surface of said heat sink, and said mounting pads of said second one(s) of said leads, respectively;

a plurality of terminal pads formed at the ends of selected said leads, respectively, proximate said heat sink; and a plurality of wires selectively ultrasonically bonded between said semiconductor die, and selected ones of said terminal pads, electrically interconnecting the same.

11. The assembly of claim 10, further including at least one relatively heavy conductor ultrasonically bonded between selected semiconductor die and said terminal pads.

12. The assembly of claim 9, further including:

a plurality of terminal pads formed at the ends of selected third dies of said leads, respectively, proximate said heat sink; and a plurality of semiconductor die individually rigidly mounted upon the mounting surface of said heat sink, and said mounting pads of said second ones of said leads; and means for electrically interconnecting said semiconductor die to one another and to said terminal pads.

13. The assembly of claim 12, further including plastic encapsulant enclosing said assembly about the mounting surface of said heat sink, and about said terminal pads.

14. The assembly of claim 9, wherein said extended ends of said second ones of said leads are offset to place their associated mounting pads, respectively, in a common plane between and parallel with the planes of the mounting surface of said heat sink and the primary portion of said lead frame.

* * * * *